United States Patent
Ott et al.

(10) Patent No.: US 7,510,890 B2
(45) Date of Patent: Mar. 31, 2009

(54) METHOD FOR PRODUCING A LUMINESCENCE DIODE CHIP

(75) Inventors: Hubert Ott, Bad Abbach (DE); Stefan Grötsch, Lengfeld/Bad Abbach (DE); Herbert Brunner, Sinzing (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 160 days.

(21) Appl. No.: 10/979,359

(22) Filed: Nov. 1, 2004

(65) Prior Publication Data
US 2005/0148110 A1 Jul. 7, 2005

(30) Foreign Application Priority Data
Oct. 31, 2003 (DE) ................. 103 51 349

(51) Int. Cl.
*H01L 21/00* (2006.01)
(52) U.S. Cl. ............... 438/29; 438/31; 438/32
(58) Field of Classification Search .......... 438/29, 438/31, 32
See application file for complete search history.

(56) References Cited

U.S. PATENT DOCUMENTS

| | | | |
|---|---|---|---|
| 3,875,456 A | 4/1975 | Kano et al. |
| 5,185,288 A | 2/1993 | Cook et al. |
| 5,925,898 A | 7/1999 | Spath |
| 6,066,861 A | 5/2000 | Höhn et al. |
| 6,130,147 A | 10/2000 | Major et al. |
| 6,155,699 A | 12/2000 | Miller et al. |
| 6,163,038 A | 12/2000 | Chen et al. |

(Continued)

FOREIGN PATENT DOCUMENTS

CA 2 360 502 5/2001

(Continued)

OTHER PUBLICATIONS

I. Schnitzer et al., "30% external quantum efficiency from surface textured, thin-film light-emitting diodes", Appl. Phys. Lett. 63 (16), pp. 2174-2176, Oct. 18, 1993.

(Continued)

*Primary Examiner*—Jack Chen
*Assistant Examiner*—Matthew Reames
(74) *Attorney, Agent, or Firm*—Cohen Pontani Lieberman & Pavane LLP

(57) ABSTRACT

A method for producing a luminescence diode chip, in which provision is made of a semiconductor body is provided having an epitaxially grown semiconductor layer sequence having an active zone and a radiation coupling-out area, the active zone emitting an electromagnetic radiation during operation of the luminescence diode, a large part of said electromagnetic radiation being coupled out via the radiation coupling-out area. A luminescence conversion material is arranged downstream of the radiation coupling-out area in an emission direction of the semiconductor body. A radiation-transmissive covering body having a first main area, a second main area opposite to the first main area, and also side areas connecting the first and second main areas. The covering body is applied to the radiation coupling-out area of the semiconductor layer sequence in such a way that the first main area faces the radiation coupling-out area. The application of the covering body is preceded by the application of a first conversion layer, having a luminescence conversion material, to the first main area of the covering body.

17 Claims, 3 Drawing Sheets

U.S. PATENT DOCUMENTS

| | | | |
|---|---|---|---|
| 6,294,800 B1 * | 9/2001 | Duggal et al. | 257/89 |
| 6,345,903 B1 | 2/2002 | Koike et al. | |
| 6,504,301 B1 | 1/2003 | Lowery | |
| 6,514,782 B1 | 2/2003 | Wierer, Jr. et al. | |
| 6,580,097 B1 | 6/2003 | Soules et al. | |
| 6,696,703 B2 * | 2/2004 | Mueller-Mach et al. | 257/98 |
| 6,858,464 B2 | 2/2005 | Yamazaki et al. | |
| 6,917,057 B2 | 7/2005 | Stokes et al. | |
| 6,921,929 B2 | 7/2005 | LeBoeuf et al. | |
| 6,969,946 B2 | 11/2005 | Steranka et al. | |
| 6,987,613 B2 | 1/2006 | Pocius et al. | |
| 7,026,656 B2 | 4/2006 | Lin et al. | |
| 7,053,419 B1 | 5/2006 | Camras et al. | |
| 2001/0000622 A1 * | 5/2001 | Reeh et al. | 257/98 |
| 2002/0030194 A1 * | 3/2002 | Camras et al. | 257/98 |
| 2002/0030444 A1 * | 3/2002 | Muller-Mach et al. | 313/512 |
| 2002/0084462 A1 * | 7/2002 | Tamai et al. | 257/79 |
| 2002/0141006 A1 * | 10/2002 | Pocius et al. | 359/15 |
| 2002/0171911 A1 | 11/2002 | Maegawa | |
| 2003/0227249 A1 | 12/2003 | Mueller et al. | |
| 2004/0072383 A1 | 4/2004 | Nagahama et al. | |
| 2004/0207999 A1 * | 10/2004 | Suehiro et al. | 362/84 |
| 2005/0285128 A1 | 12/2005 | Scherer et al. | |

FOREIGN PATENT DOCUMENTS

| | | |
|---|---|---|
| DE | 195 27 026 A1 | 2/1997 |
| DE | 199 24 316 A1 | 11/2000 |
| DE | 103 14 524 | 10/2004 |
| JP | 2000-022222 * | 1/2000 |
| JP | 2003-101074 | 4/2003 |
| WO | WO 98/12757 | 3/1998 |
| WO | WO 01/24284 | 4/2001 |
| WO | WO 01/39282 A2 | 5/2001 |
| WO | WO 01/47039 A1 | 6/2001 |
| WO | WO 01/65613 A1 | 9/2001 |

OTHER PUBLICATIONS

Office Action issued Oct. 9, 2008 in U.S. Appl. No. 10/978,759 and received by applicants' attorneys on Oct. 17, 2009.

* cited by examiner

METHOD FOR PRODUCING A LUMINESCENCE DIODE CHIP

RELATED APPLICATION

This patent application claims the priority of German Patent Application 10351394.3, the disclosure content of which is hereby incorporated by reference.

FIELD OF THE INVENTION

The invention relates to a method for producing a luminescence diode chip, in which provision is made of a semiconductor body having an epitaxially grown semiconductor layer sequence having an active zone and a radiation coupling-out area, the active zone emitting an electromagnetic radiation during operation of the luminescence diode, which electromagnetic radiation, at least in part, is coupled out via the radiation coupling-out area, and in which a luminescence conversion material is arranged downstream of the radiation coupling-out area in an emission direction of the semiconductor body.

BACKGROUND OF THE INVENTION

A luminescence conversion material is a material having constituents by means of which an electromagnetic radiation emitted by the semiconductor layer sequence during operation of the luminescence diode chip can be converted into a radiation having an altered wavelength.

U.S. patent application Ser. No. 10/204,576 describes a method for producing a light-emitting semiconductor component with a luminescence conversion element. In the case of this method, firstly a semiconductor body is produced, mounted onto a carrier element, and also electrically connected to component terminals. Afterward, a luminescence conversion material is applied directly to at least one surface of the semiconductor body or to an adhesion layer situated there.

If the surface of the semiconductor layer sequence is at least partly uneven, for example roughened, a luminescence conversion material can be applied uniformly directly to said surface only to a limited extent.

SUMMARY OF THE INVENTION

It is an object of the present invention to specify an improved method for producing a luminescence diode chip of the type mentioned in the introduction.

This and other objects are attained in accordance with one aspect of the present invention directed to a method for producing a luminescence diode chip, comprising providing a semiconductor body having an epitaxially grown semiconductor layer sequence having an active zone and a radiation coupling-out area, the active zone emitting an electromagnetic radiation during operation of the luminescence diode, which electromagnetic radiation, at least in part, is coupled out via the radiation coupling-out area. A radiation-transmissive covering body is provided having a first main area, a second main area opposite to the first main area, and also side areas connecting the first and second main areas. The covering body is applied to the radiation coupling-out area such that the first main area faces the radiation coupling-out area, the application of the covering body being preceded by the application of a first conversion layer, having a luminescence conversion material, to the first and/or the second main area of the covering body.

In an embodiment of the invention, the luminescence conversion material is not applied directly to the semiconductor layer sequence, but rather is firstly applied to at least one of the main areas of the covering body and only afterward is applied with the covering body to the radiation coupling-out area of the semiconductor layer sequence. The first main area of the covering body is expediently formed in smooth fashion, so that the luminescence conversion material can advantageously be applied in a layer of high uniformity. This is possible by means of the method according to the invention independently of the respective constitution of the radiation coupling-out area.

The separate application of the conversion layer to the covering body may be carried out under conditions which might be inherently harmful to a functionality of the semiconductor layer sequence, such as e.g. relatively high pressure and/or relatively high temperatures.

A method according to an embodiment of the invention can advantageously be carried out separately from mounting and electrical contact connection of the semiconductor body on a carrier element. Preferably, the luminescence diode chips are mounted and electrically contact-connected on a carrier element only after the conclusion of the method. As an alternative, however, it is equally possible, as early as during the method, for the semiconductor body to be mounted and/or electrically contact-connected on a carrier element and then for the covering body to be applied.

In one embodiment of the method, before the covering body is applied to the radiation coupling-out area, the color locus (CIE chromaticity diagram) of the luminescence diode chip without an applied covering body is determined. Afterward, the color locus of the luminescence diode chip is set within a desired or predetermined range by correspondingly choosing the quantity and/or the composition of the luminescence conversion material contained in the first conversion layer.

In this case, in a variant of the embodiment, the first conversion layer may for example be applied to the covering body only after the color locus of the luminescence diode chip per se, i.e. without an applied covering body, has been determined. The quantity and/or composition of the luminescence conversion material can thus be adapted in accordance with the respective measurement result.

As an alternative, it is e.g. also possible to provide a multiplicity of covering bodies with an applied first conversion layer, the first conversion layers in each case having different quantities and/or compositions of the luminescence conversion material. After measuring the color locus of the luminescence diode chip without an applied covering body, it is possible, in order to set a desired color locus, to select and apply a covering body with a matching prefabricated conversion layer.

In a further embodiment of the method, before the covering body is applied to the radiation coupling-out area, a second conversion layer, having a luminescence conversion material, is advantageously applied to the radiation coupling-out area of the semiconductor layer sequence. In connection with the invention, "application of the covering body to the radiation coupling-out area" does not mean that covering body and radiation coupling-out area then have to directly adjoin one another. Rather, further material layers such as the second conversion layer or else an adhesion promoting layer may be arranged between them.

The application of the covering body to the radiation coupling-out area is preferably effected by adhesive bonding by means of an adhesive, for which a silicone-based adhesive is preferably used. One advantage of a silicone-based adhesive is that the latter has a relatively low sensitivity toward ultraviolet radiation.

The covering body is preferably formed as a covering plate in which the side areas, at least in part, do not run perpendicular to a main plane of extent of the covering plate.

In addition to its function as a carrier body for the first conversion layer, the covering body can be formed as a radiation-shaping optical element. Depending on the concrete design of the covering body, it is thus possible to achieve e.g. an increased coupling-out of radiation from the luminescence diode chip or a reduction of the divergence of radiation coupled out from the luminescence diode chip.

For this purpose, the side areas of the covering body can be essentially parabolically, hyperbolically or elliptically curved.

In a particular embodiment, the covering body is advantageously formed as a CPC-, CEC- or CHC-like optical concentrator, which means here and hereinafter a concentrator whose reflective side areas, at least in part and/or at least to the greatest possible extent, have the form of a compound parabolic concentrator (CPC), a compound elliptic concentrator (CEC) and/or a compound hyperbolic concentrator (CHC). In this case, the first main area of the covering body is the actual concentrator output, so that radiation, compared with the customary application of a concentrator for focusing, passes through the latter in the opposite direction and is thus not concentrated, but rather leaves the covering body with reduced divergence through the second main area.

Preferably, the second main area of the covering body, at least in part, is curved or structured in the manner of a refractive and/or diffractive lens.

As an alternative or in addition, the covering body advantageously has holographic structures or elements. Patterns or graphics can thereby be projected with the luminescence diode chip.

In a further advantageous embodiment of the method, the side areas of the covering body, at least in part, are provided with a layer or layer sequence, preferably with a metallic layer, which is reflective with respect to a radiation emitted by the luminescence diode chip to be produced during the operation thereof. What can thereby be achieved is that a greater proportion of radiation is emitted in a desired emission direction from the luminescence diode chip.

The covering body is advantageously formed from a material admixed with a luminescence conversion material. This luminescence conversion material may be a different material than in the first conversion layer, which incidentally also holds true for the luminescence conversion material in the second conversion layer described previously.

Expediently, the covering body is essentially formed from a material whose expansion coefficient essentially corresponds to the expansion coefficient of a material of the semiconductor layer sequence. A material that essentially comprises a borosilicate glass or is based on a borosilicate glass is preferably used for this purpose.

The luminescence diode chip is particularly preferably formed as a thin-film luminescence diode chip that is distinguished in particular by the following characteristic features:

(a) a reflective layer is applied or formed at a first main area of the semiconductor layer sequence that faces toward a carrier element, said reflective layer reflecting at least a part of the electromagnetic radiation generated in the semiconductor layer sequence back into the latter;

(b) the semiconductor layer sequence has a thickness in the region of 20 μm or less, in particular in the region of 10 μm; and (c) the semiconductor layer sequence contains at least one semiconductor layer with at least one area having a disordering structure that ideally leads to an approximately ergodic distribution of the light in the epitaxial layer sequence, i.e. it has an as far as possible ergodically stochastic scattering behavior.

A basic principle of a thin-film luminescence diode chip is described for example in I. Schnitzer et al., Appl. Phys. Lett. 63 (16), Oct. 18, 1993, 2174-2176, the disclosure content of which in this respect is hereby incorporated by reference.

In an alternative embodiment of the method, the luminescence diode chip is provided for flip-chip mounting, which has the consequence that the radiation coupling-out area is an outer area of a substrate of the semiconductor body that is opposite to the semiconductor layer sequence. In the case of a flip-chip, the radiation coupling-out area is free of electrical contact material, so that the covering body can be applied in areal fashion on the entire radiation coupling-out area.

DETAILED DESCRIPTION OF THE DRAWINGS

In the exemplary embodiments and figures, identical or identically active component parts are in each case provided with the same reference symbols. The component parts illustrated and also the relative sizes of the component parts among one another are not to be regarded as true to scale. Rather, some details of the figures are illustrated with their size exaggerated in order to afford a better understanding.

Figure 1:
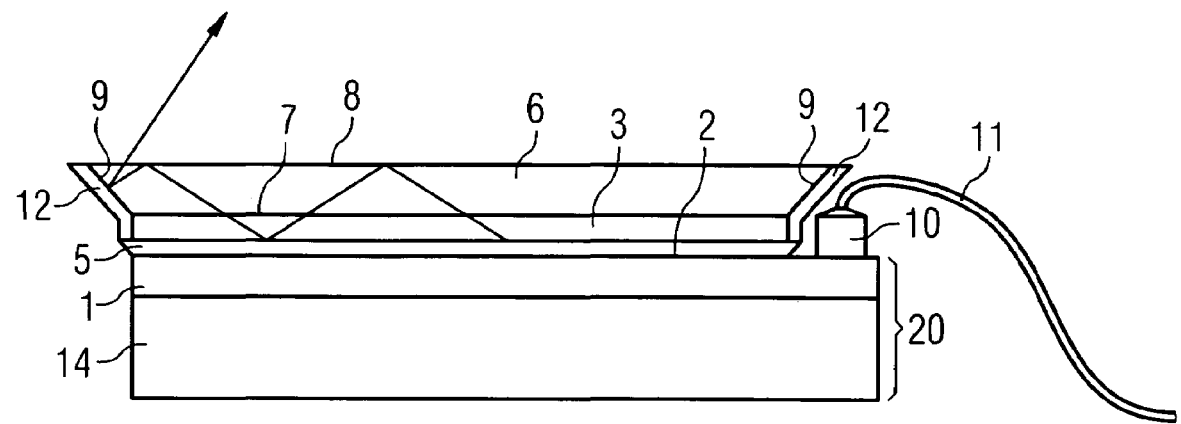
FIG. 1 shows a luminescence diode chip produced according to a first exemplary embodiment of the method in a diagrammatic illustration.

FIG. 1 illustrates a luminescence diode chip produced in accordance with a first exemplary embodiment of the method. This exemplary embodiment comprises the method step of providing a semiconductor body 20 having an epitaxially grown semiconductor layer sequence 1 applied on a substrate 14.

The substrate 14 may be a growth substrate, which means that the semiconductor layer sequence 1 is grown directly on the substrate 14. As an alternative, the substrate 14 may also be a carrier substrate, as is the case for example with thin-film luminescence diode chips. In this case, in order to produce the semiconductor body 20, the semiconductor layer sequence 1 is firstly grown on a growth substrate and subsequently applied on a carrier substrate by the main area remote from the growth substrate. The growth substrate is removed at least in part from the semiconductor layer sequence 1. Further characteristic features of thin-film luminescence diode chips are mentioned in above in paragraph numbers 0025 to 0029.

Thin-film luminescence diode chips have a virtually Lambertian emission characteristic, which is particularly advantageous if the radiation coupling-out area 2 is covered with a thin conversion layer 3, since virtually the entire radiation is coupled out through the radiation coupling-out area 2 and only a small proportion is coupled out laterally.

The semiconductor layer sequence is based e.g. on a nitride compound semiconductor material, i.e. at least one layer of the semiconductor layer sequence has a material from the system $In_xAl_yGa_{1-x-y}N$ where $0 \leq x \leq 1$, $0 \leq y \leq 1$ and $x+y \leq 1$. Moreover, the semiconductor layer sequence 1 may for example have a multiple quantum well structure, as is described for instance in U.S. patent application Ser. No. 09/913,394, the disclosure content of which in this respect is hereby incorporated by reference.

Instead of the multiple quantum well structure, it is also possible to use a single quantum well structure, a double heterostructure or a single heterostructure.

A further method step comprises the provision of a covering body 6. The covering body 6 has a first main area 7, a second main area 8 and also side areas 9 connecting the first and second main areas 7, 8. A conversion layer 3 is applied to the first main area 7.

There are various possibilities for producing the covering body 6 provided with a conversion layer 3. On the one hand, the covering body 6 may be provided in a finished form and the conversion layer 3 may subsequently be applied to the first main area 7. As an alternative, it is possible e.g. to provide a material slice which is provided for the production of a multiplicity of covering bodies and to which the conversion layer 3 is applied and which is subsequently singulated together with the conversion layer 3 to form a multiplicity of covering bodies 6 and, if appropriate, is postprocessed, e.g. shaped.

The covering body 6 illustrated in FIG. 1 is produced for example by a baseplate provided with a conversion layer 3 being singulated by means of a V-shaped saw blade to form a multiplicity of covering bodies whose planar side areas 9 run obliquely with respect to a main plane of extent of the basic body 6. As an alternative, the conversion layer 3 may also be applied only after the material slice has been singulated to form the covering bodies 6. After sawing, it might be necessary to polish the side faces of the covering body 6 and of the conversion layer 3, depending on the roughness of the side faces after sawing is completed.

In the case of the exemplary embodiment of the method for producing the luminescence diode chip illustrated in FIG. 1, the side areas 9 of the covering body 6 and of the conversion layer 3 applied thereto are provided with a reflective layer or layer sequence 12. For this purpose, e.g. a metal layer made of silver may be vapor-deposited onto the side areas 9. As an alternative, e.g. only the side areas 9 of the covering body 6 are coated.

By means of the reflective coating 12, electromagnetic rays (represented by the arrow in FIG. 1) that would be coupled out laterally from the covering body 6 without the reflective coating 12 are reflected back again. The beveled side areas 9 of the covering body 6 have the effect that a large part of electromagnetic rays that are kept in the covering body 6 and the conversion layer 3 on account of multiple total internal reflection are reflected in such a way with respect to the radiation coupling-out area 8 that they couple out from the covering body 6 at said radiation coupling-out area 8.

Before the application of the covering body 6 with the applied conversion layer 3 and the reflective coating 12 to the semiconductor layer sequence 1 of the semiconductor body 20, the color locus of the electromagnetic radiation emitted by the semiconductor layer sequence 1 upon application of an operating voltage is measured. This may also already be effected for example if the semiconductor layer sequence 1 is still situated in a fashion joined together in a wafer or, for example also on a carrier film.

On account of manufacturing tolerances, jointly produced semiconductor bodies 20 of a wafer generally have different emission spectra. The color loci and positions of semiconductor bodies 20, which are joined together in a wafer, can be measured and listed in a wafer map, and a desired color locus can subsequently be set for all the luminescence diode chips by covering bodies 6 with a matching conversion layer being applied, depending on the emission spectrum of the semiconductor body 20, in an automated method. In other words, a desired color locus of the luminescence diode chip is set by correspondingly choosing a quantity of luminescence conversion material and/or the composition of the luminescence conversion material contained in the conversion layer 3.

This may be effected for example by the conversion layer 3 being applied to the covering body 6 only after the determination of the color locus of the luminescence diode chip with the adapted quantity and/or composition of the luminescence conversion material. As an alternative, it is e.g. also possible to provide a multiplicity of prefabricated covering bodies 6 with an applied conversion layer 3, in the case of which the conversion layers have properties that are achieved for example by means of different quantities and/or compositions of the luminescence conversion material. From said covering bodies, it is possible to select one whose conversion layer 3 leads to desired properties of the luminescence diode chip.

A variation of the quantity of luminescence conversion material in the conversion layer 3 may be achieved for example by means of a variation of the concentration of the luminescence conversion material. As an alternative, the concentration may also be kept constant and the thickness of the conversion layer 3 may be varied.

If the precise setting of a specific color locus for all the luminescence diode chips is not all that important, an unsingulated material slice with an applied conversion layer may also be applied to a complete wafer or a partial region of a wafer or some other composite of semiconductor bodies. Afterward, semiconductor wafer and material slice are jointly singulated to form luminescence diode chips.

The luminescence conversion material comprises e.g. at least one phosphor. What are suitable for this purpose are, by way of example, inorganic phosphors, such as garnets doped with rare earths (in particular Ce), or organic phosphors, such as perylene phosphors. Further suitable phosphors are cited for example in U.S. Pat. No. 6,066,861, the content of which in this respect is hereby incorporated by reference.

Furthermore, it is possible to embed the luminescence conversion material in a matrix material, which may be for example a material identical to that from which the covering body 6 is produced. By virtue of the identical materials and thus identical refractive indices, it is possible to avoid, to the greatest possible extent, reflections of electromagnetic rays at the interface between the conversion layer 3 and the covering body 6.

Suitable materials for the covering body 6 and/or the matrix material of the conversion layer 3 may be glasses, in which case e.g. a borosilicate glass, in particular, may be advantageous. Borosilicate glass may be chosen in terms of its precise composition in such a way that its thermal expansion coefficient is matched to the expansion coefficient of the semiconductor body 20, that is to say that the matrix material of the conversion layer 3 has an expansion coefficient that is identical or at least similar to that of layers of the semiconductor body 20.

The production of the luminescence diode chip illustrated in FIG. 1 is then concluded by applying the covering body 6 on the semiconductor layer sequence 1 in such a way that its first main surface area 7 faces the semiconductor layer sequence 1. This may be effected by means of adhesive bonding, for example, in which case a silicone-based adhesive, for example, may be used as the adhesive 5.

In the case of the luminescence diode chip illustrated in FIG. 1, the conversion layer 3 is applied on the first main area 7 of the covering body 6. However, it is equally possible to apply a conversion layer 3 additionally or alternatively on the second main surface area 8 of the covering body 6, so that the conversion layer 3 is not arranged between the covering body 6 and the semiconductor body 20 but rather on that side of the covering body 6 which is removed from the semiconductor body 20. If a conversion layer is applied on both main areas, the luminescence conversion material respectively contained therein may be identical or different.

On its surface, the semiconductor layer sequence 1 has an electrically conductive contact and also a bonding pad 10, to which a bonding wire 11 is soldered, by means of which the semiconductor layer sequence 1 can be electrically conductively connected from one side to a voltage source. In this case, the bonding wire 11 does not, however, belong to the luminescence diode chip itself.

In order to leave free a continuous area that is as large as possible for the application of the covering body 6 on the semiconductor layer sequence 1, the bonding pad 10 is arranged at an edge of the radiation coupling-out area 2. As an alternative, it is also possible for the covering body 6 and the conversion layer 3 to be provided with a hole in the center, in order to arrange the bonding pad 10 in the center of the radiation coupling-out area 2, as is generally the case. A more symmetrical application of electric current to the semiconductor body 20 may thereby be achieved.

A further possibility is to provide the semiconductor body 20 for flip-chip mounting, so that all the electrical connection areas are formed on the semiconductor layer sequence and the radiation coupling-out area is an area of a substrate of the semiconductor body 20 that is located on the opposite side. In the case of such a flip-chip, the radiation coupling-out area is free of any contact material. A component with a flip-chip is disclosed for example in U.S. Pat. No. 6,514,782, the disclosure content of which in this respect is hereby incorporated by reference.

The luminescence diode chips illustrated in FIGS. 1 to 5 differ in each case by virtue of their differently shaped covering bodies 6.

Figure 2:
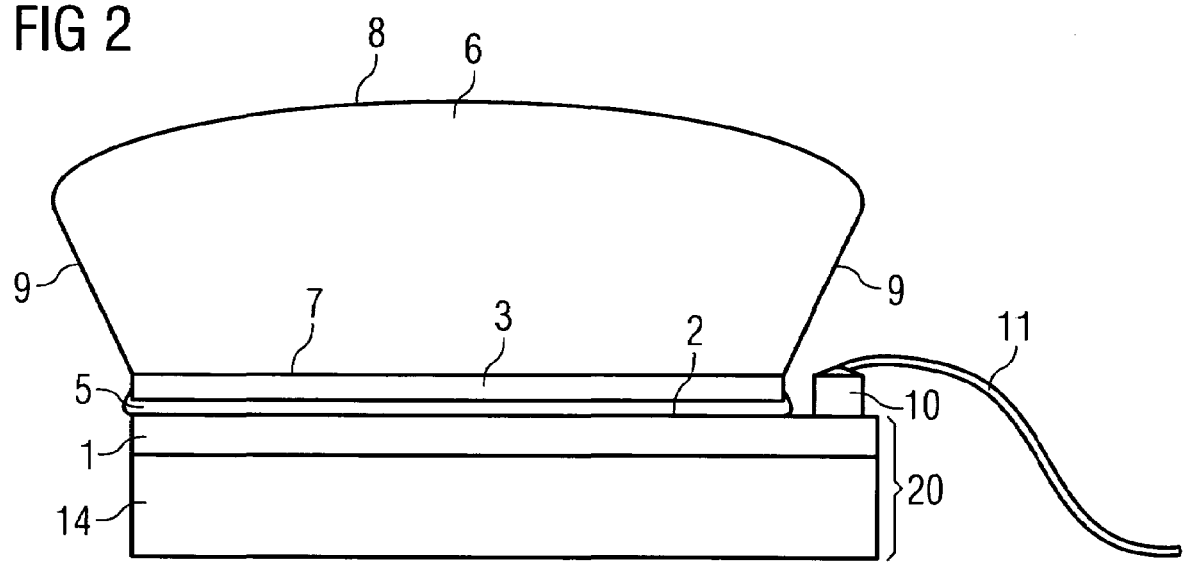
FIG. 2 shows a luminescence diode chip produced according to a second exemplary embodiment of the method in a diagrammatic illustration.

The covering body 6 of the luminescence diode chip illustrated in FIG. 2 has, just like the covering body 6 illustrated in FIG. 1, side areas 9 running obliquely with respect to a main plane of extent of the covering body 6. However, a difference between these covering bodies is that the one illustrated in FIG. 2 has a second main surface area 8 that does not run parallel to a main plane of extent of the covering body 6, but rather bulges outward in lenticular fashion. This results in an improved coupling-out of radiation and also a further beam shaping.

Figure 3:
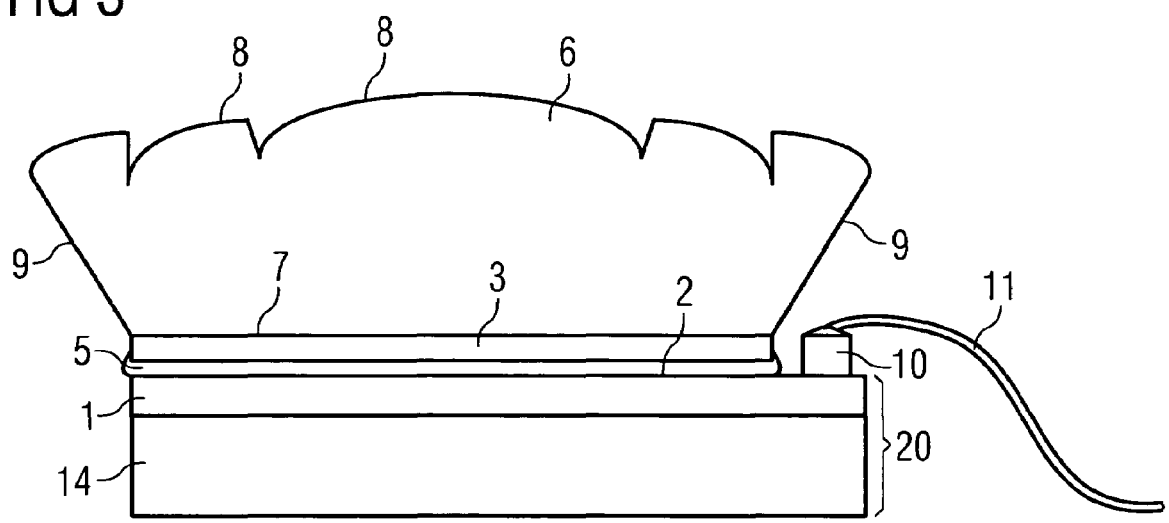
FIG. 3 shows a luminescence diode chip produced according to a third exemplary embodiment of the method in a diagrammatic illustration.

An alternative shaping of the second main surface area 8 of the covering body 6 is illustrated in FIG. 3. Here the second main area 8 has the form of a TIR lens (total internal reflection lens), the structures of which effect beam shaping by means of total internal reflection.

Figure 4:
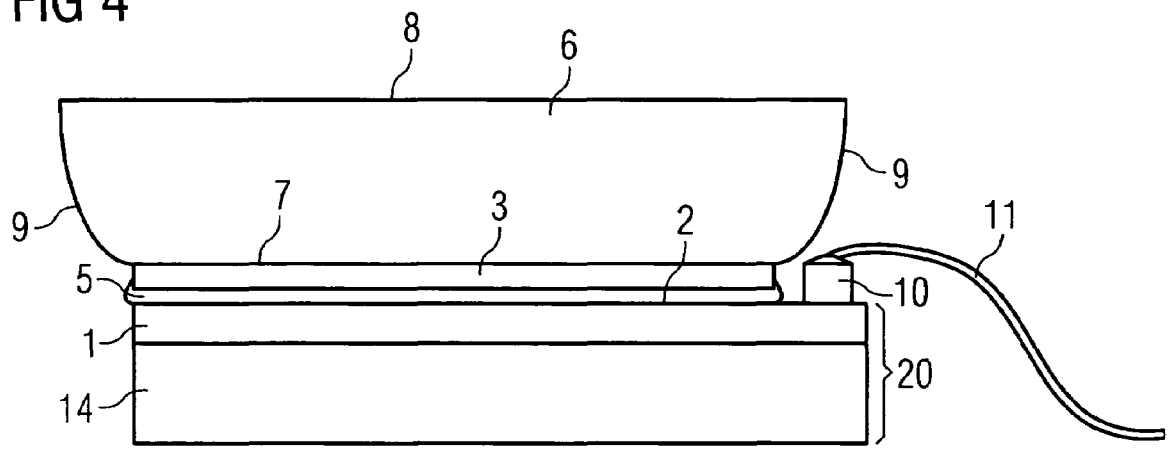
FIG. 4 shows a luminescence diode chip produced according to a fourth exemplary embodiment of the method in a diagrammatic illustration.

The covering body 6 of the luminescence diode chip illustrated in FIG. 4 does not have planar but rather parabolically shaped side areas 9. This covering body 6 has the form of a CPC-like optical concentrator that is used in the opposite direction for reducing the divergence of the radiation emitted by the semiconductor layer sequence 1. A concentrator is usually used for focussing radiation, i.e., the light enters through the bigger main surface and leaves the concentrator on the smaller main surface, thereby being focused. In the present invention, the concentrator is used the other way around, i.e., the light enters the concentrator through the smaller main surface and is not concentrated, but it leaves the concentrator through the bigger main surface with reduced divergence.

Figure 5:
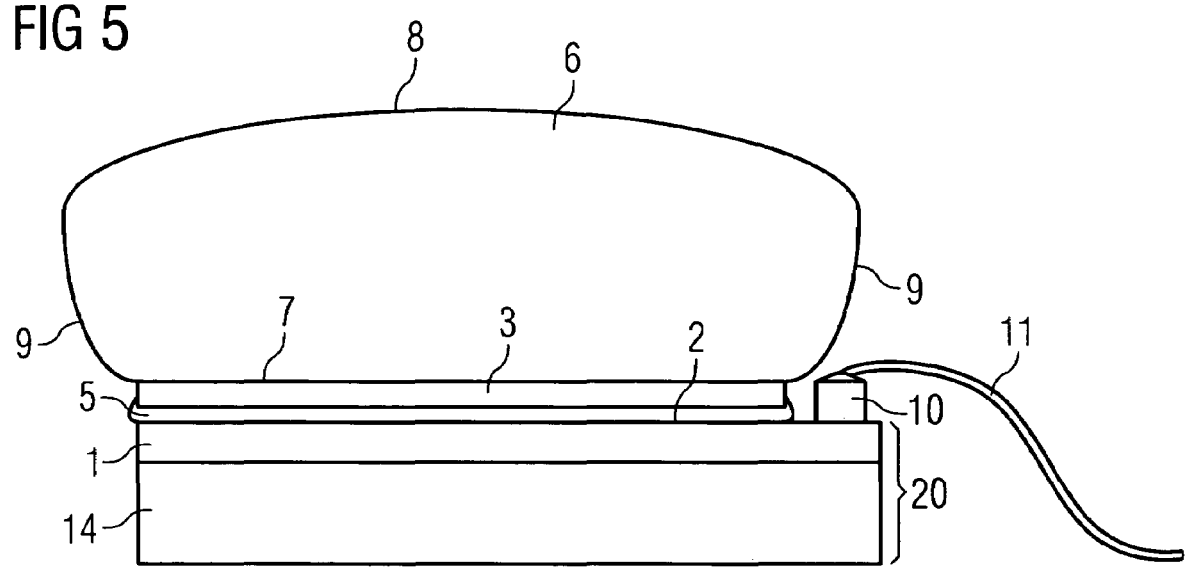
FIG. 5 shows a luminescence diode chip produced according to a fifth exemplary embodiment of the method in a diagrammatic illustration and FIG. 6 shows a luminescence diode chip produced according to a sixth exemplary embodiment of the method in a diagrammatic illustration.

It is possible to effect a further beam shaping by means of a particular shaping of the second main surface area 8. Thus, the second main surface area 8 may be formed such that it bulges outward at side areas 9 in lenticular fashion, as illustrated in FIG. 5, or may have a structure that effects beam shaping by means of total internal reflection as illustrated in FIG. 6.

Figure 6:
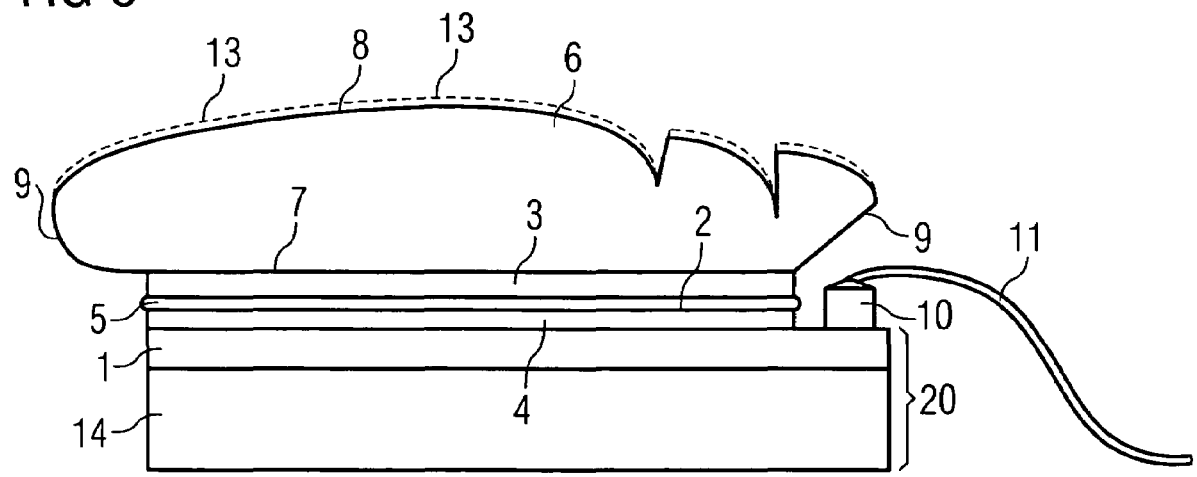

In FIG. 6, the side areas 9 of the covering body 6 are moreover formed in part in bulged fashion and in part in plane fashion. Furthermore, the second main surface area 8 of the covering body illustrated in FIG. 6 has diffractive surface structures 13 represented symbolically by the dashed line. Such diffractive structures make it possible to bring about a further beam shaping and/or an improved coupling-out of radiation or reduced reflectivity of the second main area 8. If the covering body 6 is produced e.g. from a suitable plastic, the diffractive structures can be produced for instance by hot embossing.

In addition or as an alternative to the previously mentioned possibilities for configuration of the covering body 6, the latter may also be provided with holographic structures or elements.

In contrast to the luminescence diode chips illustrated in FIGS. 1 to 5, the one illustrated in FIG. 6 has a second conversion layer 4.

During production, said second conversion layer is applied directly on the radiation coupling-out area of the semiconductor body 20. After the application of the second conversion layer 4, the surface area of the conversion layer 4 which is remote from the semiconductor body 20 forms at least a part of the radiation coupling-out surface area 2 to which the covering body 6 is subsequently applied.

If the color locus of the luminescence diode chip is determined before the application of the covering body 6, then this determination may be effected either before or after the application of the second conversion layer 4 in the case of a method for producing the luminescence diode chip illustrated in FIG. 6.

The luminescence conversion material of the second conversion layer 4 may be identical to that of the first conversion layer 3. If, in this case, firstly the second conversion layer 4 is applied and then the color locus of the luminescence diode chip is measured, a fine tuning of the color locus of the resulting luminescence diode chip can be carried out through a targeted choice of the quantity of luminescence conversion material in the first conversion layer 3. As an alternative, however, it is also possible to use different luminescence conversion materials with different phosphors, for example, for the first and second conversion layers 3, 4.

In addition or as an alternative, the covering body 6 itself may be formed from a material which is admixed with a luminescence conversion material. Consequently, the method according to the invention overall affords a multiplicity of possibilities for configuration of the resulting color locus of the luminescence diode chip.

The scope of protection of the invention is not restricted by the description of the invention on the basis of the exemplary embodiments. Thus, it is possible, for example, for the second conversion layer to be applied not only to the radiation coupling-out area of the semiconductor body but also to side areas of the latter, so that electromagnetic radiation that is coupled out laterally from the semiconductor body is also converted into a radiation having an altered wavelength. Moreover, it is possible that the transition from the side areas of the covering body to the second main area is not clearly definable, rather that the second main surface area merges fluidly with the side areas or else directly adjoins the first main surface area.

The invention encompasses any new feature and also any combination of features, which comprises any combination of features of different patent claims and various exemplary embodiments even if said combination is not explicitly specified in each case.

We claim:

1. A method for producing a luminescence diode chip, comprising:
   providing a semiconductor body having an epitaxially grown semiconductor layer sequence having an active zone and a radiation coupling-out area, the active zone emitting an electromagnetic radiation during operation of the luminescence diode, which electromagnetic radiation, at least in part, is coupled out via the radiation coupling-out area;
   providing a radiation-transmissive covering body having a first main area, a second main area opposite to the first main area, and also side areas connecting the first and second main areas; and
   applying the covering body to the radiation coupling-out area such that the first main area faces the radiation coupling-out area, the application of the covering body being preceded by the application of a first conversion layer, having a luminescence conversion material, to at least one of the first and second main areas of the covering body,
   wherein the step of applying the covering body includes adhesively bonding the covering body onto the radiation coupling-out area using a separate adhesive layer, which is different from the first conversion layer.

2. The method as claimed in claim 1, in which, before the covering body is applied to the radiation coupling-out area, the color locus (CIE chromaticity diagram) of the luminescence diode chip is determined and then a desired color locus of the luminescence diode chip is set by correspondingly choosing at least one of a quantity and a composition of the luminescence conversion material contained in the first conversion layer.

3. The method as claimed in claim 1, in which, before the covering body is applied to the radiation coupling-out area, a second conversion layer, having a luminescence conversion material, is applied to the radiation coupling-out area of the semiconductor layer sequence.

4. The method as claimed in claim 1, in which the adhesive layer is arranged between the radiation coupling-out area of the semiconductor body and the first main area of the covering body.

5. The method as claimed in claim 1, in which the covering body is formed as a radiation-shaping optical element.

6. The method as claimed in claim 5, in which the covering body is formed as a covering plate whose side areas, at least in part, do not run perpendicular to a main plane of extent of the covering plate.

7. The method as claimed in claim 5, in which the side areas of the covering body are formed in essentially parabolically, hyperbolically or elliptically curved fashion.

8. The method as claimed in claim 5, in which the covering body is a CPC-, CEC- or CHC-like optical concentrator, the first main area of the covering body being the actual concentrator output, so that radiation, compared with the customary application of a concentrator for focusing, passes through the latter in the opposite direction and is thus not concentrated, but rather leaves the covering body with reduced divergence through the second main area.

9. The method as claimed in claim 5, in which the second main area of the covering body, at least in part, is curved or structured in the manner of a refractive or diffractive lens.

10. The method as claimed in claim 5, in which the covering body is provided with holographic structures or elements.

11. The method as claimed in claim 1, in which the side areas of the covering body, at least in part, are provided with a layer sequence, which is reflective with respect to a radiation emitted by the luminescence diode chip during the operation thereof.

12. The method as claimed in claim 1, in which the covering body is produced from a material admixed with a luminescence conversion material.

13. The method as claimed in claim 1, in which the covering body is essentially formed from a material whose expansion coefficient essentially corresponds to the expansion coefficient of a material of the semiconductor layer sequence.

14. The method as claimed in claim 1, in which the covering body is formed from a material which essentially comprises a borosilicate glass.

15. The method as claimed in claim 1, in which the luminescence diode chip is formed as a thin-film luminescence diode chip.

16. The method as claimed in claim 1, in which the luminescence diode chip is provided for flip-chip mounting.

17. The luminescence diode chip as claimed in claim 1, in which the adhesive layer is silicone-based.

* * * * *